United States Patent
Ping et al.

[11] Patent Number: 5,752,771
[45] Date of Patent: May 19, 1998

[54] INTEGRATED CIRCUIT MODULE FIXING MECHANISM FOR TEMPERATURE CYCLING TEST

[75] Inventors: King-Ho Ping, Tainan; Jin-Yuan Lee, Hsin-Chu, both of Taiwan

[73] Assignee: Taiwan Semiconductor Manufacturing Company, Ltd., Hsin-Chu, Taiwan

[21] Appl. No.: 761,886

[22] Filed: Dec. 9, 1996

Related U.S. Application Data

[62] Division of Ser. No. 658,525, Jun. 3, 1996, Pat. No. 5,610,081.

[51] Int. Cl.$^6$ .................. G01N 17/00; G01N 3/60
[52] U.S. Cl. .................. 374/57; 248/500; 437/8; 206/710; 432/253; 414/586; 414/222
[58] Field of Search .......... 374/57, 208; 73/865.6; 437/8, 248, 247; 206/710, 711, 712; 432/153, 253; 414/150, 160, 222, 586; 219/416; 248/500

[56] References Cited

U.S. PATENT DOCUMENTS

| | | | |
|---|---|---|---|
| 3,892,520 | 7/1975 | Masujima et al. | 432/253 |
| 4,714,879 | 12/1987 | Krause | 324/158 |
| 4,815,912 | 3/1989 | Maney et al. | 414/222 |
| 4,966,549 | 10/1990 | Ohdate | 432/253 |
| 5,039,228 | 8/1991 | Chalmers | 374/57 |
| 5,065,973 | 11/1991 | Wang | 248/500 |
| 5,290,101 | 3/1994 | Englert et al. | 374/57 |
| 5,294,199 | 3/1994 | Boersen et al. | 374/57 |
| 5,368,466 | 11/1994 | Hehl | 414/222 |
| 5,452,795 | 9/1995 | Gallagher et al. | 206/711 |
| 5,549,205 | 8/1996 | Doche | 206/710 |
| 5,596,934 | 1/1997 | Hamm et al. | 248/500 |
| 5,613,776 | 3/1997 | Turner et al. | 374/57 |

FOREIGN PATENT DOCUMENTS

| | | | |
|---|---|---|---|
| 403248035 | 11/1991 | Japan | 374/57 |
| 8704526 | 7/1987 | WIPO | 374/57 |

*Primary Examiner*—Diego F. F. Gutierrez
*Attorney, Agent, or Firm*—George O. Saile; Stephen B. Ackerman

[57] ABSTRACT

An apparatus to retain integrated circuit modules during the preparation for a cycling of temperature, during the cycling of temperature, and during the post-handling after the cycling of temperature, is described. The apparatus has a specimen basket to contain the integrated circuit modules, a plurality of specimen retaining rods coupled to the specimen basket to prevent the integrated circuit modules from movement within the basket, a plurality of integrated circuit module retaining means coupled to the specimen retaining rods to secure each of the integrated circuit modules within the specimen basket, and a specimen securing rod retaining means to fasten each of the specimen retaining rods to the specimen basket.

18 Claims, 4 Drawing Sheets

INTEGRATED CIRCUIT MODULE FIXING MECHANISM FOR TEMPERATURE CYCLING TEST

This is a division of application Ser. No. 08/658,525, filed Jun. 3, 1996, now issued as U.S. Pat. No. 5,610,081.

BACKGROUND OF THE INVENTION

1. Field of the Invention

This invention relates to the testing of integrated circuit modules and particularly to the preparation of said integrated circuit modules to be subjected to cycling of temperature over an extreme range.

2. Description of Related Art

In order to determine how well the materials which compose integrated circuit modules will withstand changes in temperature, the integrated circuit modules must be subjected to a temperature cycling test. The integrated circuit modules are placed in a specimen basket and the specimen basket is set in a temperature cycling chamber. The temperature is raised to approximately +150° C. and then lowered to a temperature of approximately −65° C. The rate at which the temperature within the chamber is raised or lowered is dependent upon whether the testing is temperature cycling or a thermal shock. For a temperature cycling test, the temperature is raised or lowered between the +150° C. and the −65° C. in less than 5 minutes. For a thermal shock, the excursion will be in less than 2 minutes.

To accomplish the excursion of temperatures a fluid is used to transmit the temperature to the integrated circuit modules. For temperature cycling the fluid is generally air. For thermal shock a fluorocarbon based liquid with a chemical formula of:

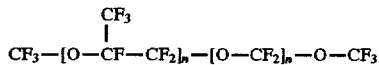

that has a commercial designation of ODO is used as the fluid to transmit the temperature to the integrated circuit modules The equipment used for temperature cycling accepts the integrated circuit modules in specimen baskets. The modules are set in the specimen baskets with no retention. As the baskets are handled and during the testing, the integrated circuit modules may be jostled into one another. When this happens, the leads of the integrated circuit modules may become damaged. U.S. Pat. No. 5,397,114 (Kitaura) describes a clamping device for fixing an integrated circuit die to the setting surface of a lateral injection molding machine so as to fill molding compound around the die to create a finished plastic integrated circuit package.

U.S. Pat. No. 4,714,879 (Krause) discloses a holding and testing device for individual integrated circuit modules to test the functioning and electrical characteristics of said integrated circuit modules.

SUMMARY OF THE INVENTION

An object of this invention is the prevention of damage to integrated circuit modules during preparation for testing, testing, and post-test handling.

This and other objects of the present invention is provided by an integrated circuit module retaining apparatus. The integrated circuit module retaining apparatus has a specimen basket into which integrated circuits are placed. A plurality of specimen retaining rods are placed at intervals across the top of the specimen basket aligning with the integrated circuit modules. A specimen retaining rod securing means secures the specimen retaining rod to the specimen basket. Each specimen retaining rod is coupled to an integrated circuit module by an integrated circuit module retaining means, thus securing the integrated circuit module to the specimen basket.

DETAILED DESCRIPTION OF THE INVENTION

Figure 1:
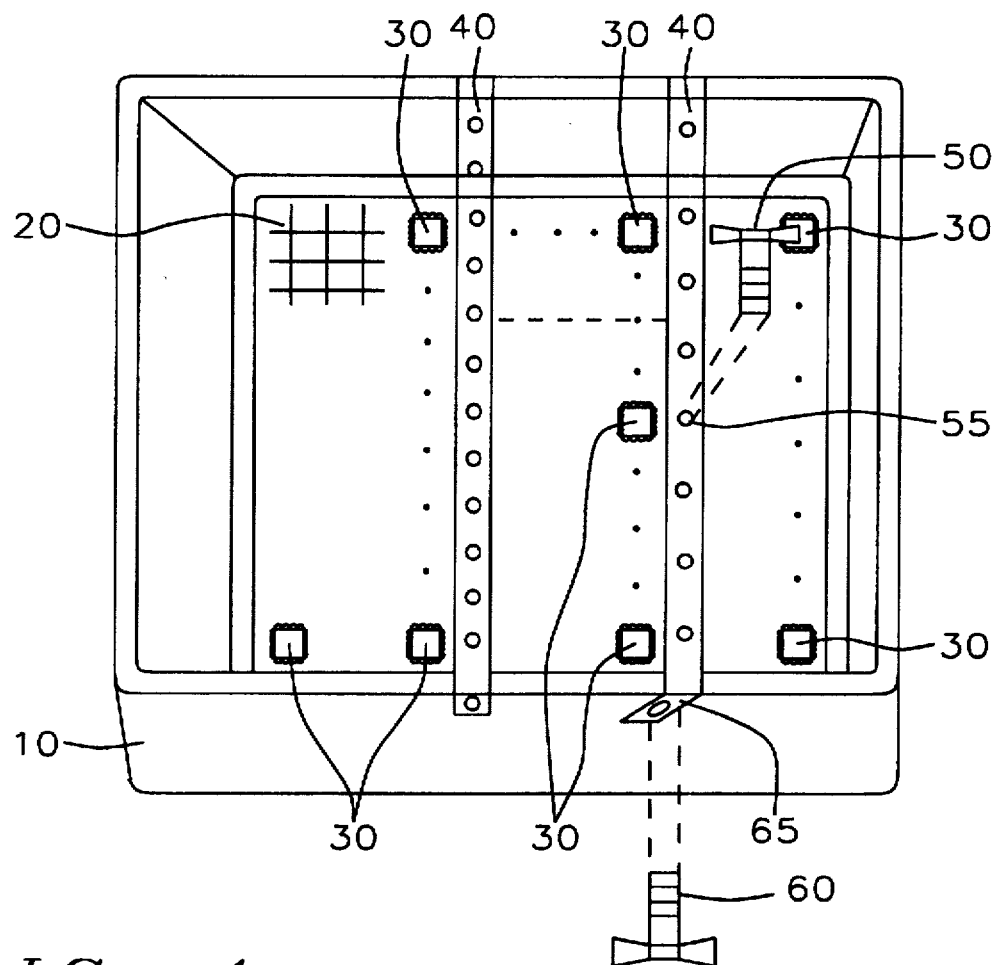
FIG. 1 is a view of a specimen basket for a two axis movement of the preferred embodiment of this invention.

Referring to FIG. 1, a specimen basket 10 whose bottom 20 is a coarse meshed material, contains a plurality of integrated circuit modules 30. The specimen basket 10 is constructed of a materials such as aluminum or stainless steel that is able to endure rapid changes of temperature in a temperature cycling chamber (not shown). The integrated circuit modules 30 are placed evenly across bottom 20 of the specimen basket 10 so as to be in close proximity but not so close as to cause damage to the leads of the integrated circuit modules 30 or to block the flow of fluid circulation from around the integrated circuits modules in the testing chamber.

A plurality of retaining rods 40 are placed over the integrated circuits modules 30. A retaining rod 40 is aligned with a row of integrated circuit modules 30. The threaded screw 60 is placed in the threaded hole 65 in the retaining rod 40 to secure the retaining rod 40 to the specimen basket 10. Another threaded screw 50 is placed in threaded hole 55 and brought in contact with the integrated circuit module 30. This prevents said integrated circuit modules 30 from shifting while the specimen basket is being prepared for and moved to the temperature cycling chamber (not shown).

Figure 2:
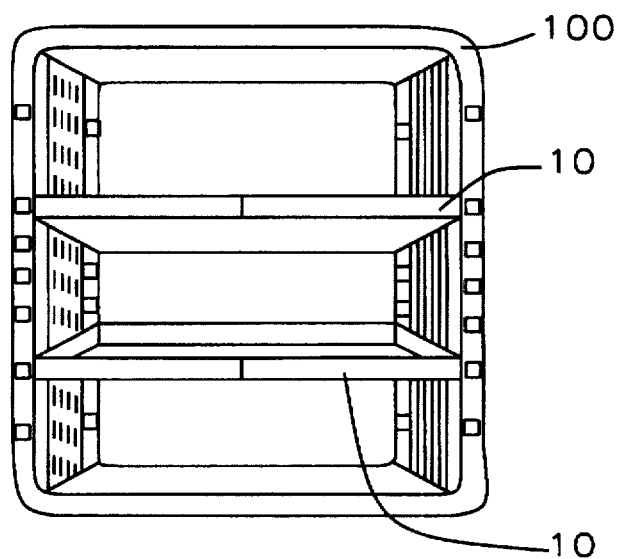
FIG. 2 is a view of the thermal cycling chamber with multiple specimen baskets of FIG. 1 loaded.

FIG. 2 shows a thermal cycling chamber 100. A plurality of specimen baskets 10 are placed within the chamber 100. The chamber 100 is sealed from the external environment. The atmosphere within the chamber is brought to a temperature of approximately +150° C. and held there for a period of approximately 10 minutes. The atmosphere within the chamber is then brought to a temperature of −65° C. for a period of approximately 10 minutes. This cycle is repeated for a large number of iterations. At the conclusion of these iterations, the specimen basket 10 is removed from the chamber 100 and the integrated circuit modules are removed from the specimen basket 10 to be tested for functioning.

When the atmosphere of the chamber 100 is changed from +150° C. to −65° C. or from −65° C. to +150° C. and if the period for this excursion is approximately 5 minutes, the test is termed temperature cycling. However, if the excursion period is less than two minutes and the cooling fluid is a liquid, then the test is termed a thermal shock. Since this change happens so rapidly, any thermally caused failure mechanisms within the integrated circuit modules will be accelerated.

Figure 3:
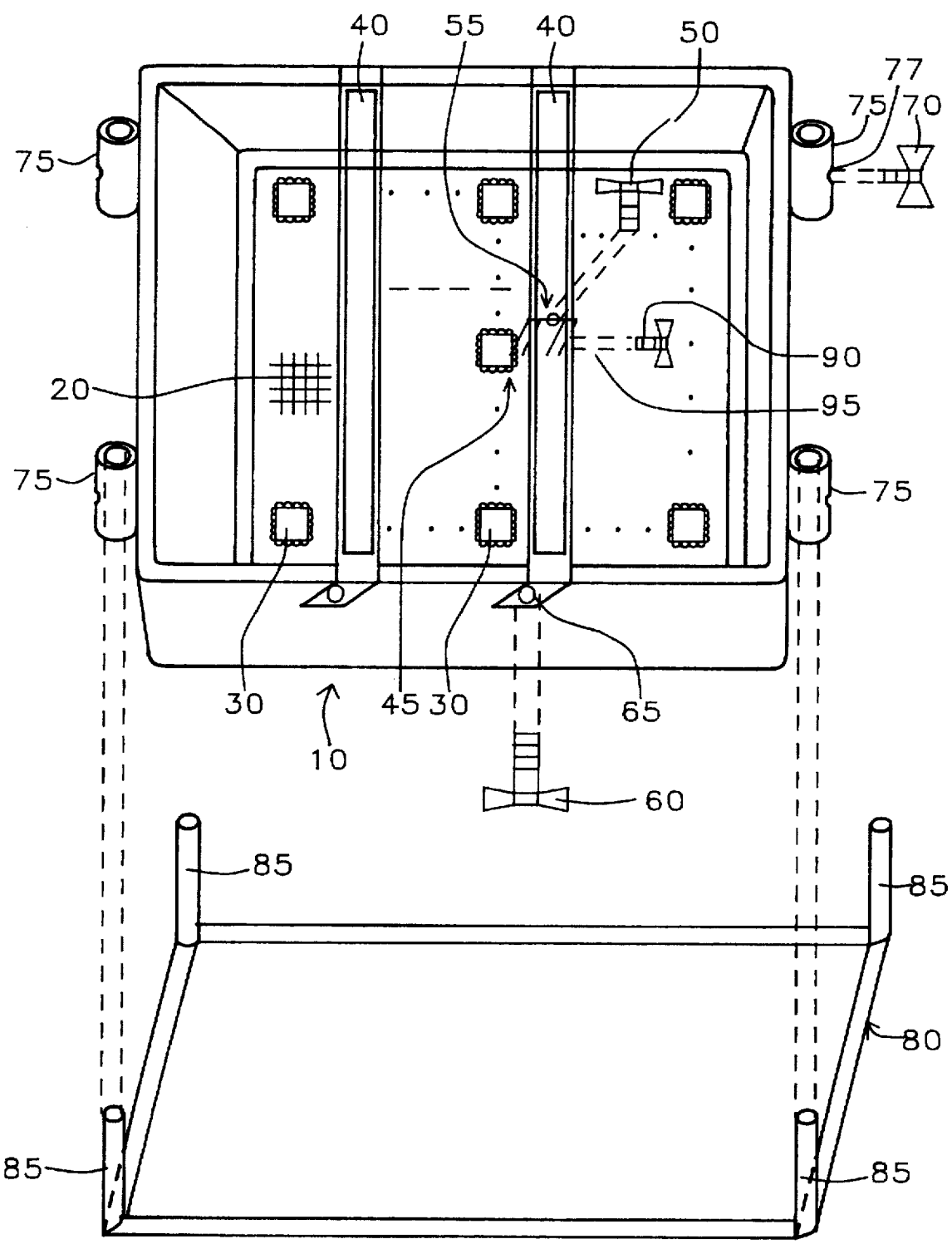
FIG. 3 is a view of a specimen basket for three axis movement of the preferred embodiment of this invention.

The thermal shock testing is often accomplished by submersion of the specimen baskets 10 into a chilled liquid such as liquid ODO as described above. FIG. 3 shows a variation of the preferred embodiment to allow the specimen basket 10 to be transported into the chilled liquid. The specimen basket 10 with the coarse meshed material bottom 20, has the integrated circuit modules 30 placed in it as in FIG. 1. A plurality of retaining rods 40 are place evenly over the integrated circuit modules 30 and secured to the specimen basket 10 by threaded screw 60 into threaded hole 65.

An integrated circuit module retainer is formed by the module retainer 45 and threaded screw 50. The integrated circuit module retainer is positioned over an integrated circuit module 30. Threaded screw 90 is placed in the threaded hole 95 and tightened to secure the integrated circuit module retainer in place. Threaded screw 50 is placed in the threaded hole 55 and adjusted so that the threaded screw 50 is in contact with the integrated circuit module 30 thus preventing movement of the integrated circuit module 30 during preparation for testing, testing, and post-testing handling.

The specimen basket 10 is placed into the bracket 80. Bracket 80 has four posts 85 onto which the four specimen basket adapters 75 are placed. The placement of the height of the specimen basket in the bracket is made at a variable distance along the four posts 85. The threaded screw 70 is placed in threaded hole 75 and the specimen basket 10 is secured to the bracket 80.

Multiple specimen baskets 10 can be placed in the bracket 80. The bracket is then placed in a thermal chamber which has separate subchambers. The first subchamber will heat the specimen baskets 10 to approximately 150° C. The specimen baskets 10 in the bracket 80 are then transferred to the second subchamber that contains a liquid that is chilled to −65° C. The bracket 80 allows multiple specimen baskets 10 to be moved simultaneously.

Figure 4:
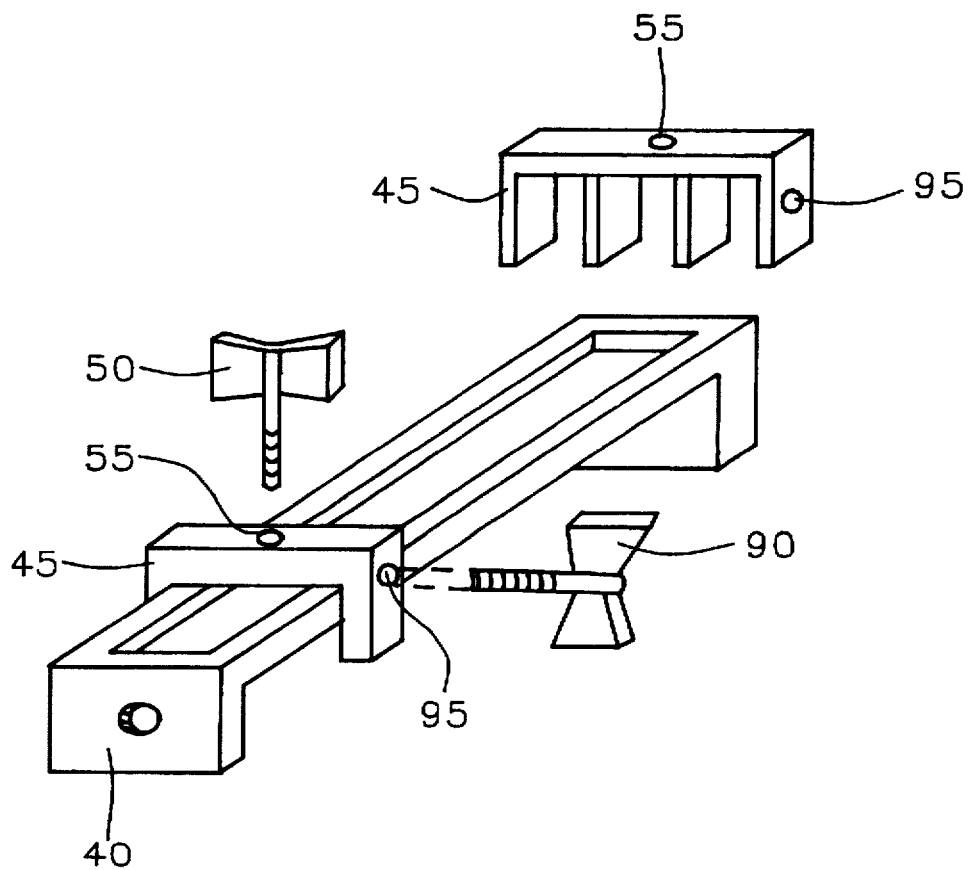
FIG. 4 is a view of a specimen retaining rod with integrated circuit module retaining fixture of a preferred embodiment of this invention.

FIG. 4 shows the retaining rod 40 with the module retainer 45. Module retainer 45 is of a material that can endure the extremes of temperature of the temperature cycling or thermal shock testing. The module retainer 45 is placed on the retainer rod 40 and secured to the retainer rod 40 by placing threaded screw 90 in the threaded hole 95. Threaded screw 50 is placed in the threaded hole 55 and adjusted so that is in contact with the integrated circuit module (30 of FIG. 3).

Figure 5:
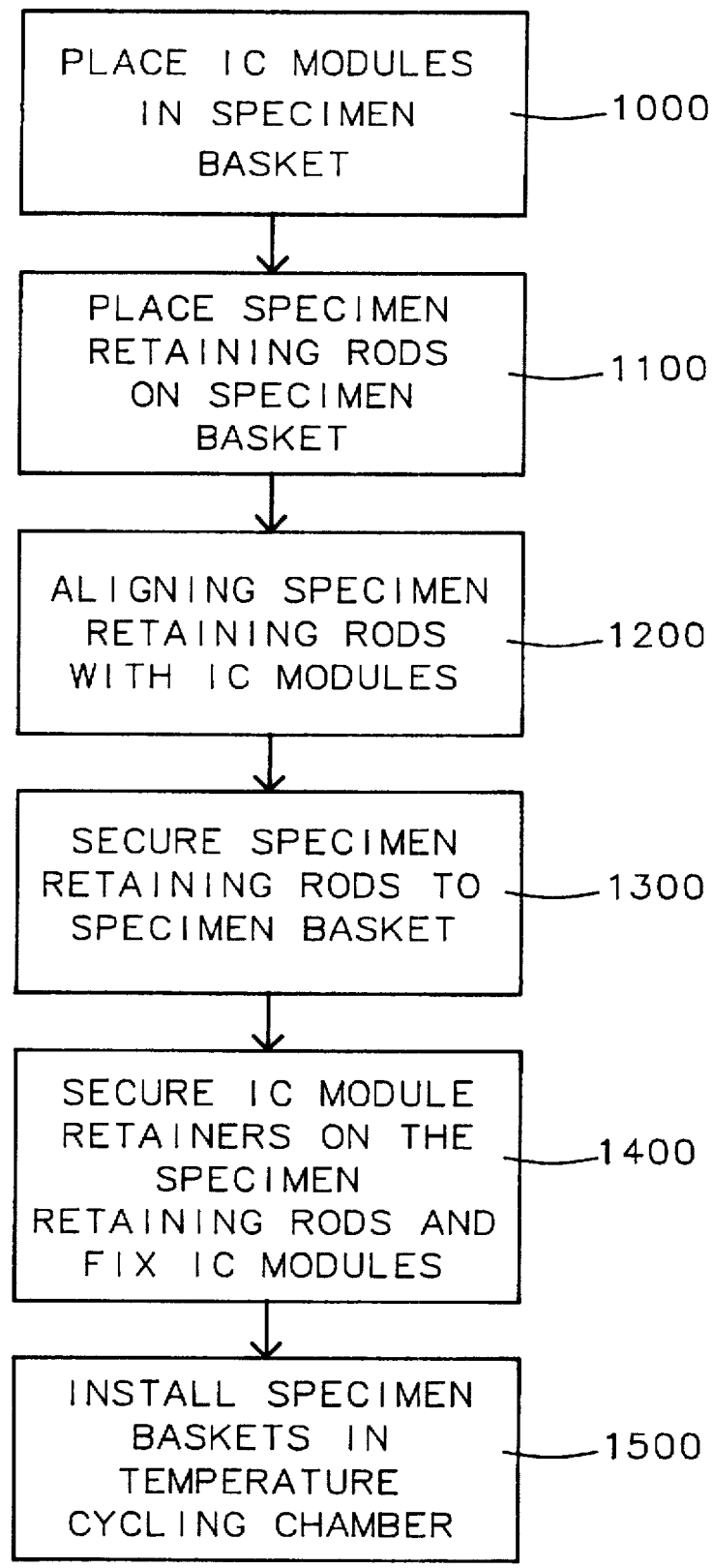
FIG. 5 is a flow chart of the method for the retention of integrated circuit modules for temperature cycling testing.

A method of for securing integrated circuit modules within a specimen basket is shown in FIG. 5. Integrated circuit modules are placed in the bottom of the specimen basket 1000. The retaining rods are placed on the specimen is basket 1200 and then aligned so that each rod aligns with a row of the integrated circuit modules 1300. The module retainers are then adjusted to secure the integrated circuit modules in place within the specimen basket 1400. The specimen basket is then installed into the temperature cycling chamber 1500.

While the invention has been particularly shown and described with reference to the preferred embodiments thereof, it will be understood by those skilled in the art that various changes in form and details may be made without departing from the spirit and scope of the invention.

What is claimed is:

1. An integrated circuit module retaining apparatus to retain integrated circuit modules to prevent damage to said integrated circuit modules from movement during handling, comprising:

a) a specimen basket to contain a plurality of integrated circuit modules while allowing a free flow of a fluid;

b) a plurality of specimen retaining rods coupled to the specimen basket to prevent the plurality of integrated circuit modules from movement within said specimen basket;

c) a plurality of integrated circuit module retaining means coupled between the specimen retaining rods and the integrated circuit modules to secure said integrated circuit modules within the specimen basket; and d) a plurality of specimen retaining rod securing means to fasten each of the plurality of specimen retaining rods to the specimen basket to allow the specimen retaining rods to align to some of the plurality of integrated circuit modules.

2. The apparatus of claim 1 wherein the specimen basket is made of a material that has an ability to endure a cycling of temperature.

3. The apparatus of claim 1 wherein the plurality of specimen retaining rod securing means are distributed upon the plurality of specimen retaining rods such that each integrated circuit module retaining means is in contact with one integrated circuit module within the specimen basket.

4. An integrated circuit module fixing device to secure to a plurality of integrated circuit modules to prevent damage in preparation for, during, and after a cycling of temperature of said plurality of integrated circuit modules within a temperature cycling chamber, comprising:

a) a specimen basket to contain said plurality of integrated circuit modules and allowing a free flow of a fluid within said temperature cycling chamber;

b) a plurality of specimen retaining rods coupled to the specimen basket to prevent said plurality of integrated circuit modules from movement within the specimen basket;

c) a plurality of integrated circuit module retaining means coupled between each of the plurality of the specimen retaining rods and each of the plurality of integrated circuit modules,respectively, to secure said integrated circuit modules from movement within the specimen retaining basket;

d) a plurality of specimen retaining rod securing means to fasten each of the plurality of specimen retaining rods to the specimen basket to allow the specimen retaining rods to align to some of the plurality of integrated circuit modules;

e) a specimen basket holding bracket to retain a plurality of said specimen baskets during the cycling of the temperature; and f) a specimen basket holding means to secure each of the plurality of specimen baskets to the specimen basket holding bracket.

5. The device of claim 4 wherein the specimen basket is of a material that has an ability to withstand the cycling of temperature.

6. The device of claim 4 wherein the plurality of specimen retaining rod securing means are distributed upon the plurality of specimen retaining rods such that each integrated circuit module retaining means is in contact with one integrated circuit module within the specimen basket.

7. The device of claim 4 wherein integrated circuit module retaining means is made of a material has the ability to endure the cycling of the temperature.

8. The device of claim 4 wherein each of the plurality of specimen baskets is placed at a variable distance on the specimen basket holding bracket.

9. The device of claim 4 wherein the specimen basket holding bracket is placed within the temperature cycling chamber.

10. An integrated circuit module temperature stressing apparatus to retain a plurality of integrated circuit modules to prevent damage to said integrated circuit modules from movement during handling, comprising:

a) a temperature stressing chamber;

b) a plurality of specimen baskets to be placed within said temperature stressing chamber so as to contain the plurality of integrated circuit modules and to allow free flowing of a fluid within the temperature stressing chamber;

c) a plurality of specimen retaining rods coupled to each specimen basket to prevent movement of those of the plurality of integrated circuit modules within said specimen basket;

d) a plurality of integrated circuit module retaining means coupled between the specimen retaining rods and the integrated circuit modules to secure said integrated circuit modules within the specimen basket; and e) a plurality of specimen retaining rod securing means to fasten each of the plurality of specimen retaining rods to the specimen basket to allow the specimen retaining rod to align to some of the plurality of integrated circuit modules.

11. The apparatus of claim 10 wherein the plurality of integrated circuits are to be subjected to intervals of cycling of the temperature from a first temperature to a second temperature and from the second temperature to the first temperature for a plurality of cycles within the temperature stressing chamber.

12. The apparatus of claim 11 wherein the specimen basket is made of a material that has an ability to endure the cycling of the temperature.

13. The apparatus of claim 10 wherein the plurality of specimen retaining rod securing means are distributed upon the plurality of specimen retaining rods such that each integrated circuit module retaining means is in contact with one integrated circuit module within the specimen basket.

14. The apparatus of claim 10 further comprising:

a) a specimen basket holding bracket to retain the plurality of specimen baskets; and b) a specimen basket holding means to secure each of the plurality of specimen baskets to the specimen basket holding bracket.

15. The apparatus of claim 14 wherein the each of the plurality of specimen baskets is placed at a variable distance on the specimen holding bracket.

16. The apparatus of claim 14 wherein the specimen basket holding bracket is placed within the temperature stressing chamber.

17. The apparatus of claim 10 wherein said temperature stressing chamber performs a temperature cycling if air is used as a temperature transmitting medium.

18. The apparatus of claim 10 wherein said temperature stressing chamber performs a thermal shock if liquid is used as a temperature transmitting medium.

* * * * *